US008716794B2

(12) United States Patent
Luo et al.

(10) Patent No.: US 8,716,794 B2
(45) Date of Patent: May 6, 2014

(54) SOI LATERAL MOSFET DEVICES

(75) Inventors: Xiaorong Luo, Chengdu (CN); Florin Udrea, Cambridgeshire (GB)

(73) Assignee: University of Electronic Science and Technology of China, Chengdu, Sichuan Province (CN)

( * ) Notice: Subject to any disclaimer, the term of this patent is extended or adjusted under 35 U.S.C. 154(b) by 55 days.

(21) Appl. No.: 13/131,779

(22) PCT Filed: Aug. 10, 2010

(86) PCT No.: PCT/CN2010/075849
§ 371 (c)(1),
(2), (4) Date: Sep. 15, 2011

(87) PCT Pub. No.: WO2011/143848
PCT Pub. Date: Nov. 24, 2011

(65) Prior Publication Data
US 2013/0193509 A1    Aug. 1, 2013

(30) Foreign Application Priority Data

May 17, 2010  (CN) .......................... 2010 1 0173833

(51) Int. Cl.
*H01L 29/78* (2006.01)
(52) U.S. Cl.
USPC ........................................................ 257/343
(58) Field of Classification Search
CPC ................................................. H01L 29/7827
USPC ........................................................ 257/330
See application file for complete search history.

(56) References Cited

U.S. PATENT DOCUMENTS 6,781,197 B2 * 8/2004 Fujishima et al. ............ 257/329
7,005,352 B2    2/2006 Fujishima
7,445,983 B2   11/2008 Fujishima

OTHER PUBLICATIONS

Won-So Son, et al., "Effects of a trench under the gate in high voltage RESURF LDMOSFET for SOI power integrated circuits," Solid-State Electronics, 2004, 48, pp. 1629-1635.
Natoto Fujishima, et al., "A trench lateral power MOSFET using self-aligned trench bottom contact holes," IEDM 1997, pp. 359-362.

* cited by examiner

*Primary Examiner* — Matthew W Such
*Assistant Examiner* — Monica D Harrison
(74) *Attorney, Agent, or Firm* — Casimir Jones SC

(57) ABSTRACT

The present invention relates to a semiconductor power device and power integrated circuits (ICs). The lateral SOI MOSFET in the present comprises a trench gate extended to the dielectric buried layer, one or multiple dielectric trenches in the drift region, and a buried gate in said dielectric trench. The permittivity of the dielectric in said dielectric trench is lower than that of said active layer. Firstly, said dielectric trench not only greatly improves breakdown voltage, but also reduces pitch size. Secondly, the trench gate widens the effective conductive region in the vertical direction. Thirdly, dual gates of said trench gate and buried gate increase channel and current densities. Thereby, specific on-resistance and the power loss are reduced. The device of the present invention has many advantages, such as high voltage, high speed, low power loss, low cost and ease of integration. The device in the present invention is particularly suitable for power integrated circuits and RF power integrated circuits.

19 Claims, 11 Drawing Sheets

SOI LATERAL MOSFET DEVICES

CROSS-REFERENCE TO RELATED APPLICATIONS

The present application is a U.S. 371 National Stage Entry of pending International Patent Application No. PCT/CN2010/075849, International Filing Date Aug. 10, 2010, which claims priority to CN201010173833.X, filed May 17, 2010, the contents of which are incorporated by reference in their entireties.

FIELD OF THE INVENTION

The present invention relates to semiconductor power devices and power integrated circuits. It specifically relates to an SOI (Semiconductor On Insulator) lateral MOSFET (Metal-Oxide-Semiconductor Field-Effect-Transistor) in power integrated circuits or RF power integrated circuits, and more particularly relates to a high breakdown voltage and low power loss lateral MOSFET.

BACKGROUND OF THE INVENTION

An SOI structure consists of a top semiconductor layer, a substrate layer and a buried dielectric layer interposed between the top semiconductor layer and the substrate layer, where said top semiconductor layer is called active layer and said substrate layer is a semiconductor layer or dielectric layer. Semiconductor devices and circuits are formed in said active layer. In integrated circuits, high-voltage devices and low-voltage circuitry are isolated by isolation trench 30, while said active layer 3 and substrate layer 1 are isolated by dielectric layer 2, as shown in FIG. 1. Therefore, compared with bulk silicon (semiconductor) technology, SOI technology offers lots of advantages, such as weakened parasitic effect, low leakage current, high integration and hard resistance to radiation and free from controllable silicon latch-up effect. These advantages enable it to be widely applied in high-speed, high temperature, lower power loss and resistance to radiation fields.

The targets of SOI power integrated circuit are to realize a high breakdown voltage, low power loss and effective isolation between high-voltage unit and low-voltage unit. Lateral SOI devices, such as LDMOSFET (Lateral Double-diffused Metal-Oxide-Semiconductor Field-Effect-Transistor), become the key components of SOI power integrated circuits because of its ease integration and low on-resistance. The lateral SOI devices have attracted much attention in plasma display panel, motor drives, automotive electronics, portable power management products, personal computers and so on. And lateral MOSFET is widely applied to RF field because of its higher switching speed than that of VDMOSFET (Vertical Double-diffused Metal-Oxide-Semiconductor Field-Effect-Transistor).

For conventional LDMOSFET devices, the drift region length monotonically increases with an increasing breakdown voltage (BV). This makes device (or circuit) chip area and cost increase, and also it is adverse to miniaturization of chip. Furthermore, the on-resistance ($R_{on}$) increases with an increase in BV (or drift region length) by the relationship $R_{on} \propto BV^{2.5}$. The increase in $R_{on}$ leads to an increase in power loss and decrease in switching speed.

Compared with planar gate MOSFETs, trench gate MOSFETs can increase packaging density and increase channel density and current density; On the other hand, it is easy to fabricate a shorter channel because the channel length is not limited by lithography process in trench gate MOSFETs. Both of them reduce $R_{on}$ and increase current capacity of trench gate MOSFETs. Furthermore, trench gate MOSFETs can eliminate the JFET (Junction Field-Effect-Transistor) effect and latch-up effect.

To solve these issues mentioned above in the conventional LDMOS, Trench-type SOI LDMOS structures were proposed owing to advantages of trench MOSFETs. In reference (Won-So Son, Young-Ho Sohn, Sie-Young Choi, "Effects of a trench under the gate in high voltage RESURF LDMOSFET for SOI power integrated circuits", Solid-State Electronics, 2004, 48, 1629-1635), the RESURF LDMOS with an trench was proposed. The device structure is shown in FIG. 2. Oxide trench 31 is introduced in drift region from the end of gate electrode G to the drain region. When the doping concentration is high, said oxide trench 31 reduces the high electric field at the surface of silicon under the gate electrode G to prevent breakdown here, and reduces the surface peak electric field at the drain side, thereby increases the breakdown voltage and reduces the specific on-resistance. The maximum breakdown voltage 356V had been achieved with the 16 μm drift region length, on 8 nm active layer 3, over 3 μm buried dielectric layer 2. BV=352V and specific on-resistance is 18.8 mΩ·cm² were obtained by experiment in this reference. Specific on-resistance is 9 mΩ·cm² for the proposed LDMOSFET at BV=250V. It can be seen that the effect of this structure on reducing the drift region length and the specific on-resistance is limited.

A structure that drain electrode D and gate electrode G were placed in one step trench was proposed in reference (Naoto Fujishima and C. Andre T. Salama, "A trench lateral power MOSFET using self-aligned trench bottom contact holes", IEDM 1997, 359-362), where a thicker sidewall oxide layer 32 is at the lower half of trench (near the drain). The structure is referred as Trench Lateral Power MOSFET with a trench bottom Drain contact (TLPM/D MOSFET). This device structure is shown in FIG. 3. In U.S. Patent (U.S. Pat. No. 7,005,352B2, 2006 Feb. 28, "trench-type MOSFET having a reduced device pitch and on-resistance"), the structure of Trench Lateral Power MOSFET with a trench bottom Source contact (TLPM/S MOSFET) was presented, where the source electrode S and gate electrode G were placed in one trench. The device structure is shown in FIG. 4. Both of TLPM/D MOSFET and TLPM/S MOSFET can reduce the pitch (or chip area) and on-resistance while maintaining a high BV. TLPM/D MOSFET is more suitable for the BV>80V MOSFET with a reduced resistance, while TLPM/S MOSFET is more suitable for the BV<80V MOSFET with a reduced pitch and resistance. The process for TLPM/D MOSFET is simpler. For the BV>100V TLPM/D MOSFET, the effect on reducing the pitch will be weakened with the increasing thickness of the thicker sidewall oxide layer 32 at the lower half of trench; meanwhile, it become difficult to fabricate the drain- and the gate-electrode in one deep and narrow trench as the trench depth increases with an increasing breakdown voltage. In these two structures, the drain- and the gate-electrode or the source- and the gate-electrode are required to fabricate in one trench, the process thereby becomes more difficult as BV increases (trench depth increases); moreover, the effect on reducing the pitch becomes weak with an increasing BV. The TLPM/S devices are used in IC in the U.S. Patent (US 2007/0298562A1, 2007 Dec. 27, "method of manufacturing a semiconductor integrated circuit device"). However, the various devices in IC are isolated by both PN junction isolation and shallow trench isolation (STI), and the source electrode and gate electrode of the high-voltage MOSFET are fabricated in the one trench. Its process thus is more complex.

SUMMARY OF THE INVENTION

The purpose of the present invention is to provide a lateral SOI MOSFET device. The trench gate and the buried gate in the dielectric trench could improve the breakdown voltage of LDMOSFET, reduces specific on-resistance, the power loss and device pitch size as well as chip area.

This invention provides a lateral SOI power MOSFET device, comprising a semiconductor substrate layer, a dielectric buried layer on said semiconductor substrate layer and an active layer on said dielectric buried layer. A trench gate is formed in said active layer. Said trench gate consists of the gate dielectric and conductive material surrounded by the said gate dielectric. The terminal of said conductive material is the trench gate electrode. Said trench gate goes through the active layer to the dielectric buried layer. On a side of said trench gate, there are the drain region and body region separating from each other on said active layer surface. The terminal of drain region is drain electrode. On said body region surface, there are source region a, body contact area and source region b in sequence and their common terminal is source electrode. Said trench gate is in contact with said body region and source region a. A dielectric trench, which is in contact with the body region and source region b, locates between source region b and said drain region. The permittivity of the dielectric in said dielectric trench is lower than that of said active layer. The depth of said dielectric trench is larger than that of the body region and less than the thickness of active layer. A buried gate of conductive material is formed in said dielectric trench in the vicinity of the source region b and surrounded by the dielectric in said dielectric trench. The depth of the buried gate is no less than the body region depth and less than that of the dielectric trench. The terminal of said buried gate is the buried gate electrode. Said trench gate electrode and buried gate electrode are connected electrically. The common terminal of trench gate electrode and buried gate electrode is called gate electrode.

In accordance with one embodiment of the present invention, said lateral SOI MOSFET device is a symmetrical structure, where said drain region is in the center of the device. Outward from the center drain region, there are said dielectric trench, source region b, body contact region, source region a and trench gate in sequence. The trench gate is fabricated in the periphery of the device in order to isolate devices or circuits by said trench gate.

The lateral SOI MOSFET device is a plane symmetry structure. The symmetry plane is the plane which vertically goes through and divides the drain region into two equal parts while not going through said dielectric trench and trench gate.

The lateral SOI MOSFET device is an axial symmetry structure. The center axis of said drain region is the axis of symmetry.

In the layout, the top view of said drain region is circle or regular polygon except triangle. The matching top views of said dielectric trench, source region b, body contact region, source region a and trench gate are cirque or regular polygons rings except triangle rings. The circle shape for said drain region, and the cirque shape of said dielectric trench, source region b, body contact region, source region a and trench gate have the best symmetry and can weaken the curvature effect. BV is improved and chip area is saved. With other regular polygon structures, such as hexagonal, are also common choices. In general, the geometrical shapes of the peripheral regions, such as said dielectric trench and trench gate, should match with the geometrical shape of said drain region in the center. For example, if the drain region is hexagonal, the said dielectric trench, source region b, body contact area, source region a and trench gate also should be hexagonal rings.

In accordance with another embodiment of the present invention, the upper portion of the gate dielectric is thinner than the lower portion of the gate dielectric. This further improves the BV.

In accordance with the present invention, there are n dielectric trenches separating from each other, where n≥2, and said buried gate is just located in the dielectric trench in contact with the body region. The multiple dielectric trenches help to improve the BV.

The conductivity type of a part of the active layer between said dielectric trenches is the same as or different from that of other part of said active layer. This allows to select appropriate process steps as required and thus increase the flexibility of the process.

The vertical depth and horizontal width of each dielectric trench, and space between two adjacent dielectric trenches are equal or not equal.

The number of said dielectric trenches is more than 3, and the dielectric trench in the middle is deeper than the dielectric trenches on both sides. This help to improve the BV.

Said drain region is in contact with said dielectric trench or not. The structure with the drain region being not in contact with said dielectric trench has a higher breakdown voltage, while the structure with the drain region being in contact with said dielectric trench has a lower resistance.

This lateral SOI MOSFET device in the present invention is used as an active device in ICs.

Said ICs is power ICs or RF power ICs.

The material of said active layer includes but does not restrict to Si, SiC, SiGe, GaAs or GaN. These materials are convenient to access and there is existed process.

The material of said active layer is Silicon, the dielectric in the dielectric trench is silicon dioxide, or the dielectric with a lower permittivity than that of $SiO_2$ and with a higher critical electric field than three times of Si: Said dielectric includes but does not restrict to SiOF, Carbon doped Oxide (CDO) or SiCOF.

Silicon dioxide is generally used as dielectric for Si semiconductor based on the existed process. The relative permittivity of 3.9 for $SiO_2$ is lower than 11.9 for Si, thereby, the electric field strength in the dielectric trench is enhanced and breakdown voltage is improved. The dielectric which has a lower permittivity than that of $SiO_2$ and a higher critical electric filed than three times of Si can further improve the BV.

The material of said active layer is Si, the gate dielectric is $SiO_2$, or the dielectric with a higher permittivity than that of $SiO_2$. Said gate dielectric includes but does not restrict to $Si_3N_4$, $Al_2O_3$, AlN or $HfO_2$. Said gate dielectric with a higher permittivity can enhance the control of gate voltage to gate charges and enhance the transconductance. Said gate dielectric can be thicker at the same gate structure MIS (Metal-Insulator-Semiconductor, gate electrode-gate dielectric-the semiconductor under the gate dielectric forming the MIS structure) capacitance, which reduces the tunnel current and avoids tunnel breakdown, and thus enhances the stability as well as reliability of the device or chips.

Said dielectric buried layer is $SiO_2$ or the dielectric with a lower permittivity than that of $SiO_2$ and a higher critical electric field than three times of Si and said active layer is Si material. And said dielectric buried layer material includes but does not restrict to SiOF, Carbon doped Oxide (CDO) or SiCOF. Said dielectric buried layer using dielectric with a lower permittivity can enhance the electric field of the dielectric buried layer, so BV is increased.

The advantages of the present invention are as follows: ① In blocking state, in the lateral direction, the dielectric in the dielectric trench between drain region and source region b shares breakdown voltage. The electric field strength in dielectric trench is far higher than that of the active layer because of the lower permittivity of dielectric (e.g. $SiO_2$) than that of the semiconductor active layer (e.g. Si). In the vertical direction, the trench gate and the dielectric trench enhance multi-dimensional depletion in the active layer; both of them greatly improve breakdown voltage at the same pitch. On the other hand, at the same breakdown voltage, the length of drift region and pitch significantly decrease, resulting in the reduced on-resistance ($R_{on}$) and power loss. Both the cost and the scale of chips could therefore be declined. ② The dielectric trench folds the drift region in the vertical direction, and this shrinks the device pitch, leading to a reduced specific on-resistance and a low chip cost, increasing switching speed. ③ In the on-state condition, the trench gate extended to the dielectric buried layer widens the effective conductive region in the vertical direction in the drift region and reduces the $R_{on}$ and power loss; Furthermore, the buried gate further increases the channel and current densities, resulting in a reduced power loss. ④ In high voltage blocking condition, the gate dielectric extended to the interface over the dielectric buried layer terminates the high potential from the drain at the center of device within the trench gate, avoiding the influence of the high potential on the low-voltage circuits outside the trench gate. Thereby, the trench gate acts as a dielectric isolation trench, saving the area of the dielectric isolation trench, simplifying isolation process in conventional SOI high-voltage IC where the dielectric isolation trench is formed by a particular process and saving the chip cost. In short, present invention offers a lateral SOI MOSFET, which has advantages including high breakdown voltage, high speed, low power loss, low cost and miniaturization, and said lateral SOI MOSFET can be easily integrated with power IC.

TAG OF DIAGRAM

1. substrate layer; 2. dielectric layer; 3. active layer; 4. gate dielectric; 5. conductive material; 61 dielectric trench; 6 dielectric filled in the dielectric trench; 7. buried gate; 8. trench gate; 9. body region; 10. body contact region; 11*a*. source region a; 11*b*. source region b; 21. trench gate electrode; 22. buried gate electrode; 30. dielectric isolation trench; 31. oxide trench; 32. thick oxide layer; 60. active layer material between dielectric trenches; S. source electrode; D. drain electrode; G gate electrode.

DETAILED DESCRIPTION OF THE INVENTION

The present invention will be described in detail by combining of drawings and embodiments.

In present invention, a combination of trench gate, buried gate and dielectric trench are used to comprehensively improve electric performances of the lateral SOI MOSFET. To simplify description, the lateral SOI MOSFET in the present invention is also referred to as the device in some places.

Embodiment 1

Figure 5:
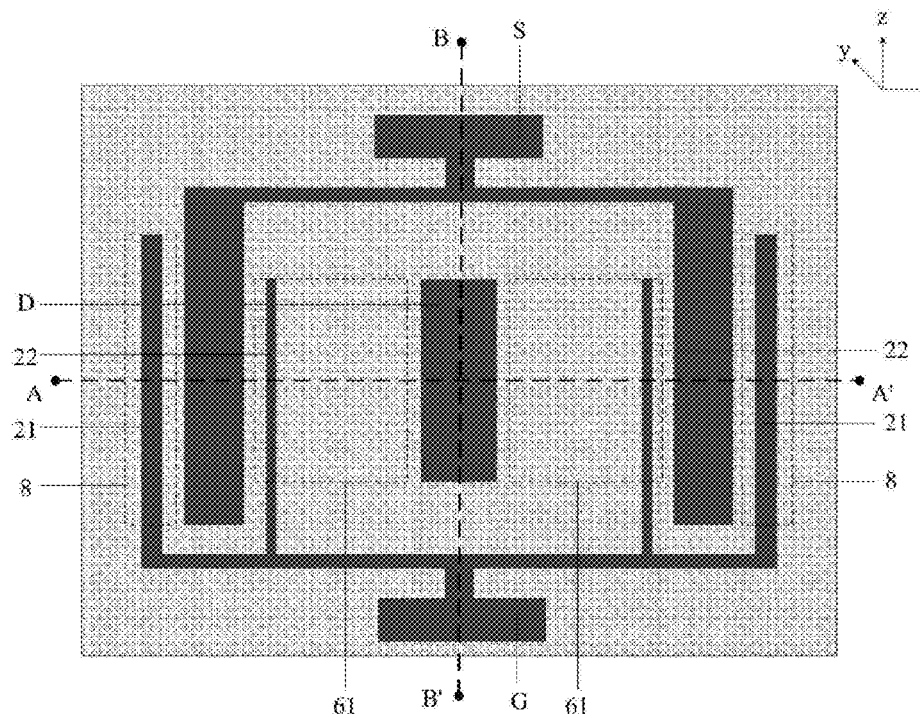
FIG. 5 is the schematic of the cell of the lateral SOT MOSFET with plane symmetry (i. e. the patterns in the xz plane). The AA' line is along the x direction, and the BB' line along the z direction, the vertical direction is the y direction; the symmetric plane is the yz plane along the BB' line.

FIG. 5 shows the layout of the cell of a lateral SOI MOSFET with plane symmetry. The figure shown is in the xz plane, wherein the AA' line is along the x direction, BB' is along the z direction, and y is the vertical direction. Symmetric plane of the device is the yz plane through BB' line. The layout in FIG. 5 includes such layers as dielectric trench 61, trench gate 8, and the metallic electrode layers: trench gate electrode 21, buried gate electrode 22, gate electrode G, source electrode S and drain electrode D. In this layout, the source region, drain region, trench gate 8, dielectric trench 61, buried gate, and other figures operating electrically are bars, and said drain electrode D is located in the center of the device, and said dielectric trench 61 is on both sides of drain electrode D; said source electrode S is in the outer side of dielectric trench 61; said trench gate 8 is located in the periphery of the device in order to isolate low voltage units from high voltage units in IC. The conductive material in dielectric trench 61 forms a buried gate, with the buried gate electrode 22 as its terminal; the terminal of the conductive material in trench gate 8 is the trench gate electrode 21; their common terminal is referred as the gate electrode G In the layout, gate electrode G and source electrode S use inter-digital structure.

Figure 6:
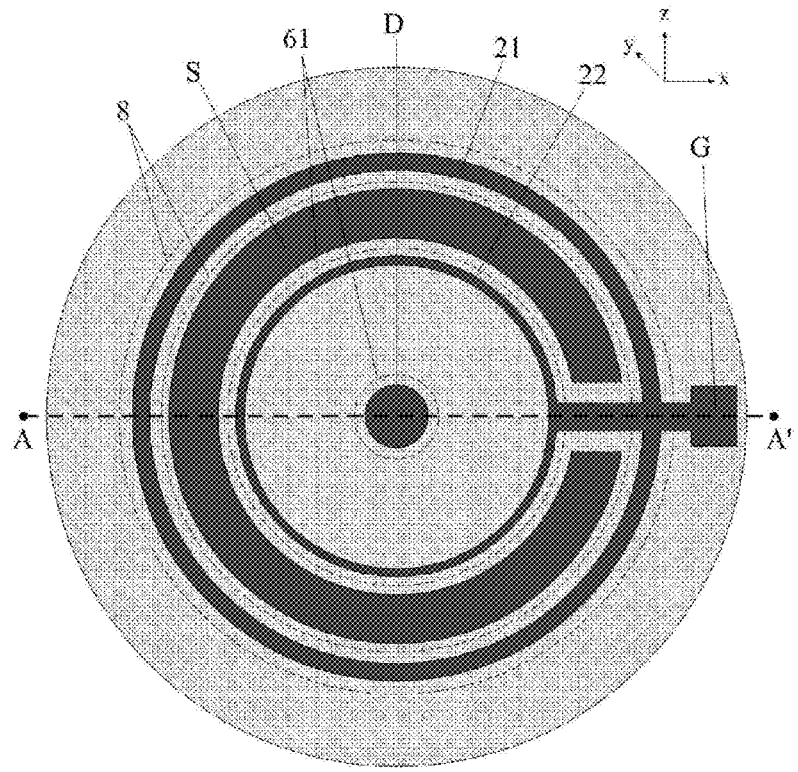
FIG. 6 is the schematic of the cell of the lateral SOT MOSFET with axial symmetry, (i. e. the patterns in the xz plane). The y axis going through the drain electrode D center is the symmetric axis. Wherein the x direction is along the AA' line, and the y direction is the vertical direction.

FIG. 6 shows the layout of the cell of a lateral SOI MOSFET with axial symmetry structure. The figure is in the xz plane and the AA' line is along the x direction. FIG. 6 shows an axi-symmetric device by taking circular patterns as an example. Drain region D is located in center of the device, and drain region D and source region b are separated by dielectric trench 61. The y-axis, the center axis of the drain electrode D, is the axis of symmetry of the device. The terminal of said buried gate in dielectric trench 61 is the buried gate electrode 22, and the terminal of the conductive material in trench gate 8 is trench gate electrode 21. The buried gate electrode 22 and trench gate electrode 21 are connected electrically and have a common terminal, referring as gate electrode G Trench gate 8 is located in periphery of the device in order to isolate low voltage units from high voltage units in IC.

Figure 7:
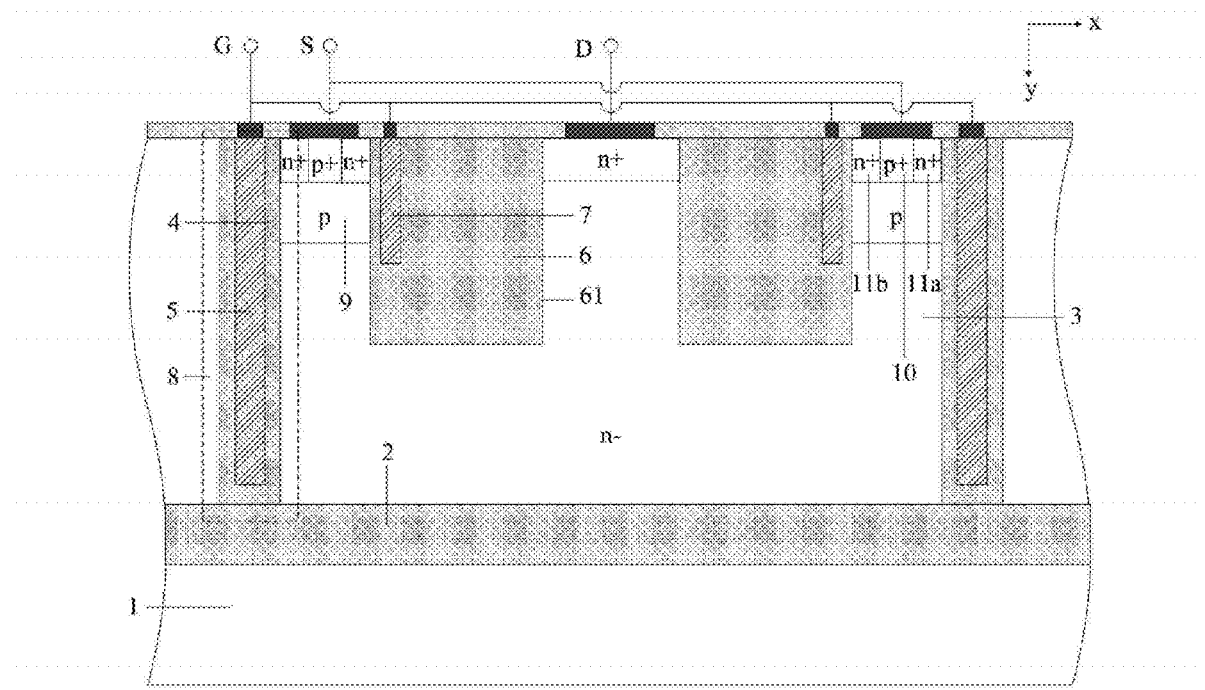
FIG. 7 is the schematic cross section of the cell of the lateral SOT N-channel MOSFET (which is the section along AA' line in the FIG. 5 or FIG. 6, i. e. the patterns in the xy plane and the same is for the following)

FIG. 7 is the schematic cross section of the cell of the lateral SOI N-channel MOSFET, i. e. the graph in the xy plane. The SOI lateral MOSFET consists of a substrate layer 1, a dielectric buried layer 2 on said substrate layer 2 and a active layer 3 on said dielectric buried layer. Trench gate 8 is formed in active layer 3, consisting of gate dielectric 4 and the conductive material 5 surrounded by gate dielectric 4. The terminal of conductive material 5 is the trench gate electrode. The trench gate 8 vertically goes through said active layer 3 to dielectric buried layer 2. Surface of said active layer on the side of the trench gate contains body region 9 and drain region, with the drain electrode D as the terminal of said drain region. There is a spacing between the body region 9 and the drain region. Source region a (i.e. 11a in FIG. 7), body contact region 10, source region b (i.e. 11b in FIG. 7) are on the surface of said body region 9 in sequence. The common terminal of source regions a and b, body contact region 10 is source electrode S. Trench gate 8 is in contact with body region 9 and said source region a. Dielectric trench 61 filled with dielectric 6 is formed between said source region b and said drain region, the permittivity of dielectric 6 is less than that of the material of active layer 3. The depth of dielectric trench 61 is more than the depth of the body region 9 and less than the thickness of said active layer 3. The conductive material inset in dielectric trench 61 forms buried gate 7, being in the vicinity of said source region b and surrounded by dielectric in dielectric trench 61. The depth of said buried gate 7 is less than the depth of dielectric trench, and is no less than that of the body region 9. The terminal of said buried gate 7 is buried gate electrode 22 connected electrically to the trench gate electrode, the common terminal of buried gate electrode 22 and trench gate electrode 21 is referred as the gate electrode G.

The trench gate structure increases the effective conductive area in the vertical direction, thus greatly reduces the specific on-resistance. Double gates of trench-gate and buried-gate increase channel density, and thus, decrease the specific on-resistance at the same device size. The dielectric trench not only improves the breakdown voltage, but also reduces the device or chip pitch, thereby reduces the on-resistance and power loss, saving cost. FIG. 7 shows a N-channel lateral SOI MOSFET with one dielectric trench 61. The fabrication process for this structure is easier, and the device has the best symmetry.

Embodiment 2

Figure 8:
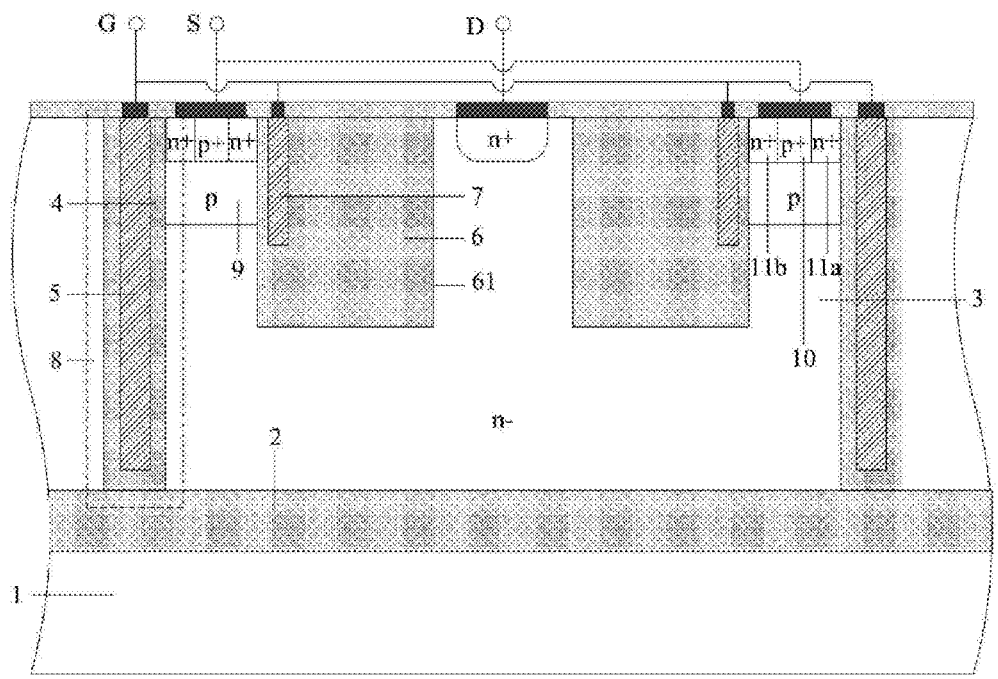
FIG. 8 is the schematic cross section of the cell of the lateral SOT N-channel MOSFET with the dielectric trench and the drain region separating from each other.

FIG. 8 shows another embodiment of the present invention, basically the same as the embodiment 1, except that n+ drain region in this embodiment is not in contact with said dielectric trench 61. Breakdown voltage increases to some extent while on-resistance increases slightly in this device, compared with that of the device structure in FIG. 7.

Embodiment 3

Figure 9:
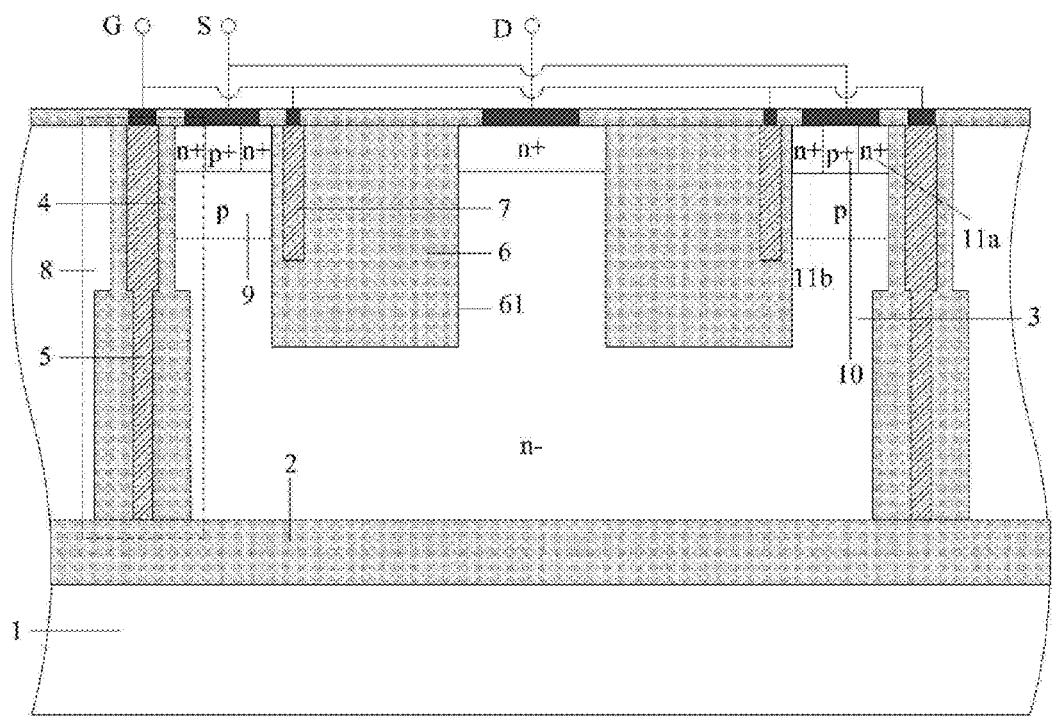
FIG. 9 is the schematic cross section of the cell of the lateral SOT N-channel MOSFET, the upper portion of the gate dielectric is thinner than the lower portion of the gate dielectric.

In this case, the upper portion of the gate dielectric 4 is thinner than the lower portion of the gate dielectric, as showed in FIG. 9. This kind of trench gate 8 structure is better to improve breakdown voltage.

Embodiment 4

Figure 10A:
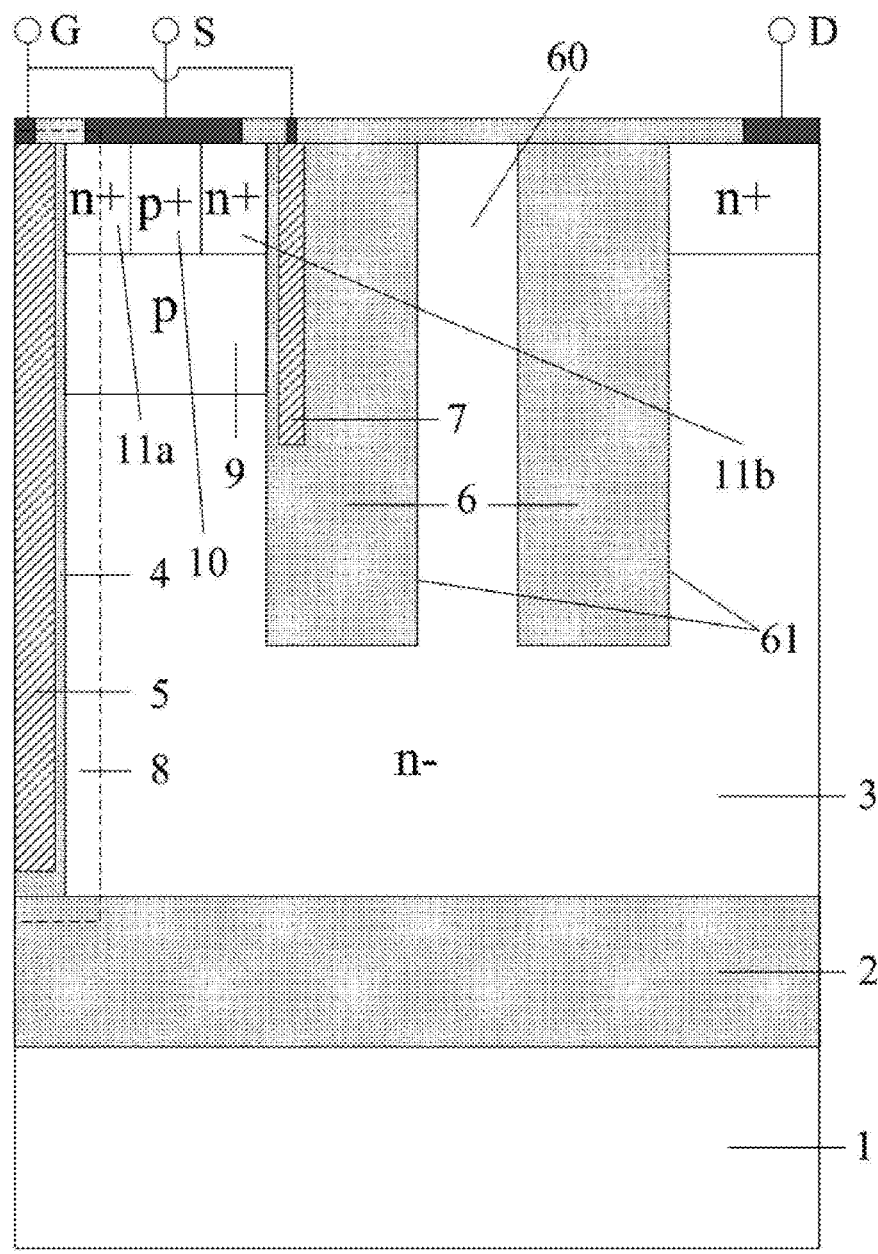
FIG. 10*a* is the schematic cross section of N-channel lateral SOT MOSFET with two dielectric trenches (for a half-cell)
Figure 10B:
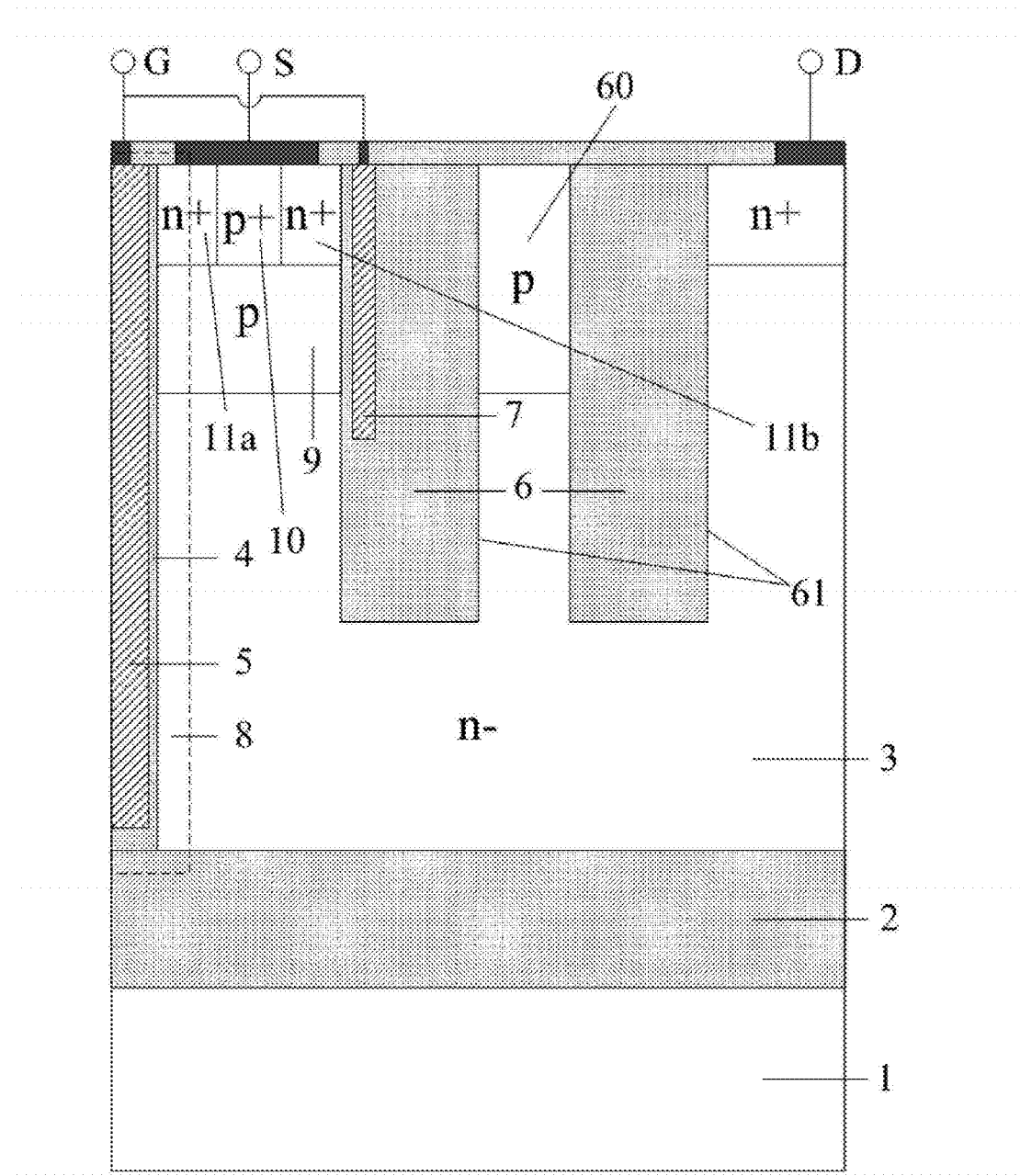
FIG. 10*b* is the schematic cross section of N-channel lateral SOT MOSFET, wherein the conductivity type of a part of the active layer between the dielectric trenches is different from that of other part of said active layer (for a half-cell)

In FIG. 10a and FIG. 10b, the N-channel lateral SOI MOSFET has two dielectric trenches 61 with the same trench depth. In FIG. 10a, the conductivity type of the active layer material 60 between dielectric trenches is the same as that of the material of said active layer 3. In order to manufacture the MOSFET, dielectric trench 61 is formed by etching and filled with dielectric 6; and then body region 9, source region, drain region, and body contact region 10 are formed by implantation and diffusion. In FIG. 10(b), the conductivity type of the active layer material 60 between dielectric trenches is different from that of the material of the active layer 3. In order to manufacture the MOSFET, body region 9 is firstly formed by epitaxy on said active layer 3, and then dielectric trench 61 is formed by etching and filled with dielectric 6; finally, body contact region, drain region n, source region, body region 9 are formed by implantation and diffusion. FIGS. 10(a) and (b) shows a half-cell.

Embodiment 5

Figure 11A:
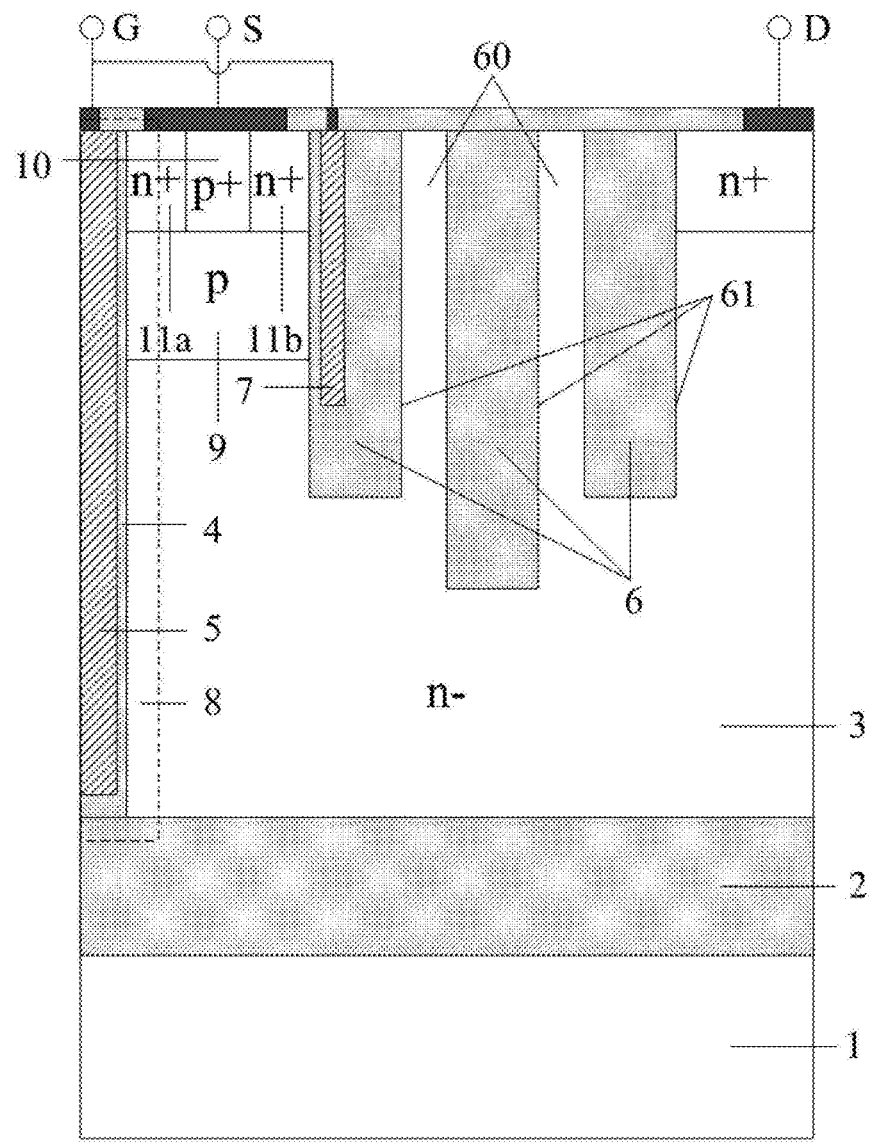
FIG. 11*a* is the schematic cross section of N-channel lateral SOT MOSFET with three different depth dielectric trenches (for a half-cell)
Figure 11B:
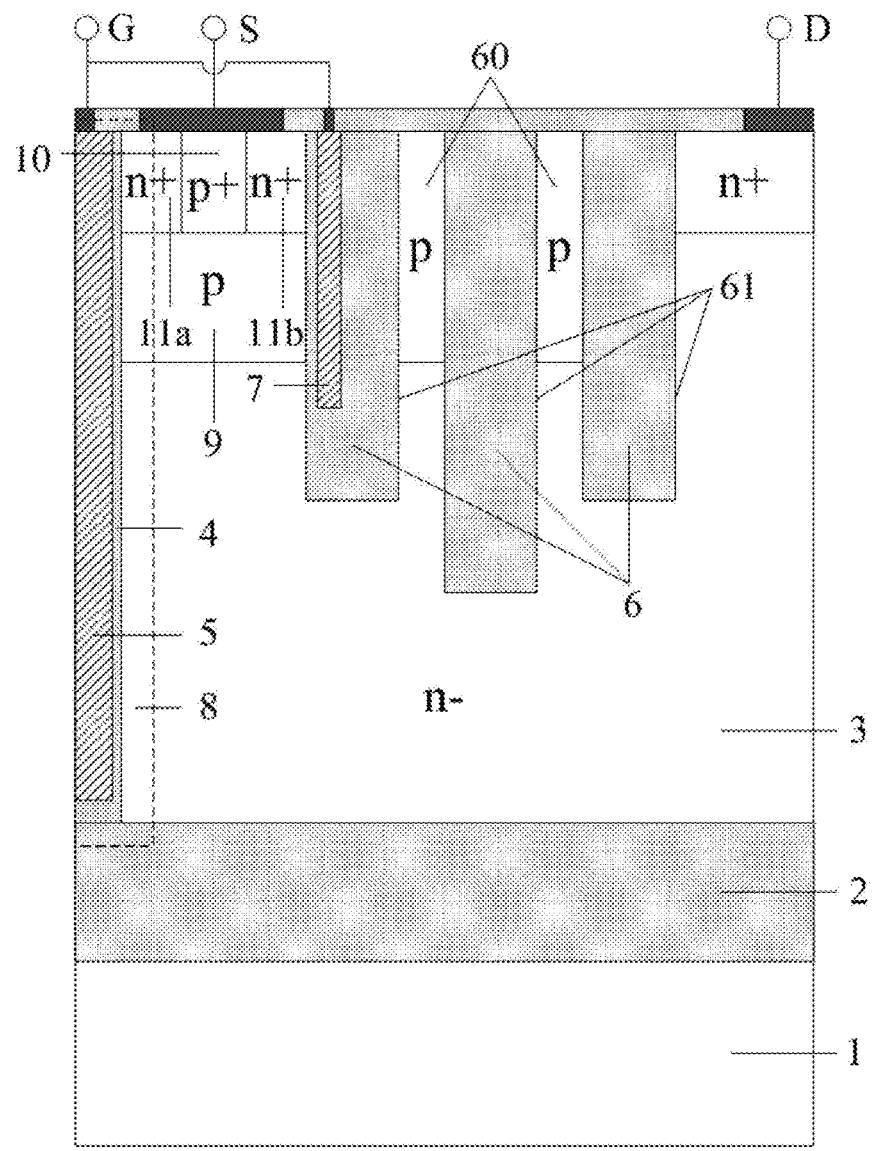
FIG. 11*b* is the schematic cross section of N-channel lateral SOT MOSFET with three dielectric trenches, wherein the conductivity type of a part of the active layer between the dielectric trenches is different from that of other part of said active layer. (for a half-cell)

In FIGS. 11(a) and (b), there are three dielectric trenches 61 for the device of this embodiment. Depths of dielectric trenches 61 are not equal. The dielectric trench 61 in the middle is deeper than dielectric trenches 61 on both sides. This kind of device structure helps to increase breakdown voltage. In FIG. 11(a), the conductivity type of the material between dielectric trenches 61 is the same as that of said active layer 3. In FIG. 11(b), the conductivity type of the material between dielectric trenches 61 is different from that of active layer 3.

Embodiment 6

Figure 12:
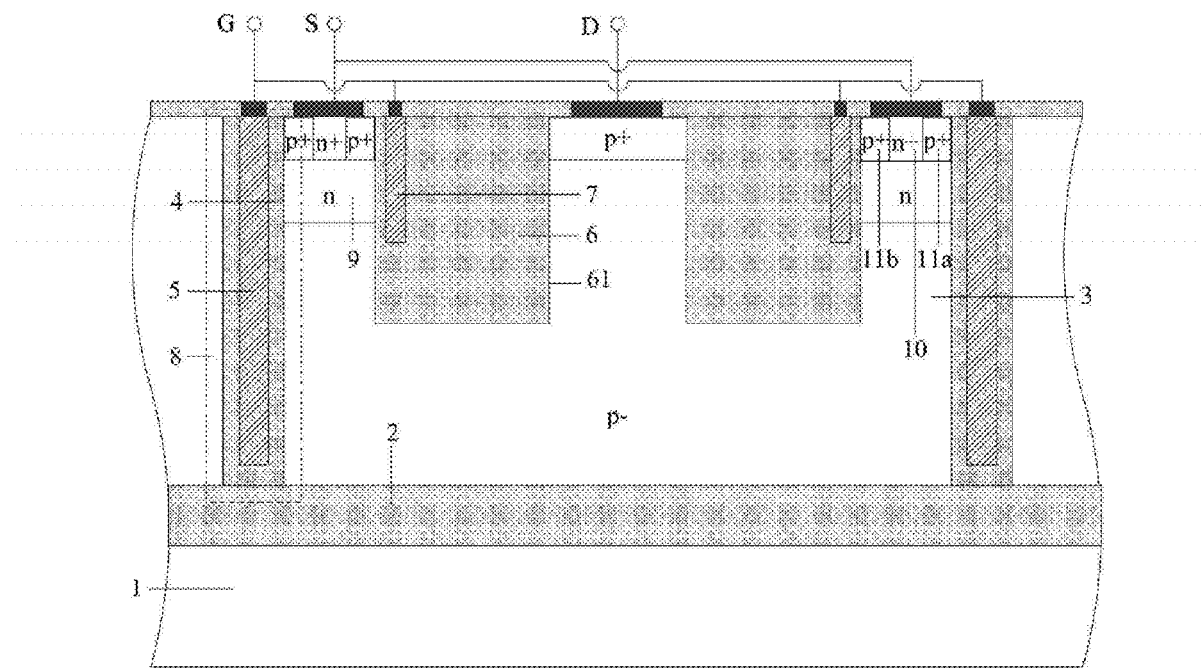
FIG. 12 is the schematic cross section of the cell of P-channel lateral SOI MOSFET.

FIG. 12 shows a P-channel lateral SOI MOSFET with one single dielectric trench 61. In said P-channel lateral SOI MOSFET, the conductivities type of the materials of the active layer 3, source region a, source region b, drain region, body region 9 and body contact region 10 are opposite to those of N-channel lateral SOI MOSFET (as shown in FIG. 7 and FIG. 8). Other characteristics can be referred to embodiment 1.

These structures from embodiment 2 to the embodiment 5 are applicable to P-channel lateral SOI MOSFET. The conductivities type of the materials of the active layer 3, source region a, source region b, drain region, body region 9 and body contact region 10 in P-channel lateral SOI MOSFET are opposite to those of N-channel lateral SOI MOSFET (as shown in FIG. 7-FIG. 11).

BV will increase as the number of dielectric trenches 61 increases. But too many dielectric trenches make patterns narrower and fabrication process more difficult. Depth and width of each dielectric trench, space between two adjacent dielectric trenches can be equal or not equal when multiple dielectric trenches are used.

The Lateral SOI MOSFET device in the present invention is most suitable for the active components of integrated circuit, especially for power integrated circuits and RF power integrated circuits.

Devices (or ICs) in embodiments mentioned above of the present invention can use Si, SiC, SiGe, GaAs or GaN as the material of active layer 3. These materials are easily available and the fabrication process is mature. They can achieve the high performances for devices or circuits.

Polysilicon is a good choice for both the conductive material 5 and conductive material of said buried gate if Si is used as active layer material.

Dielectric 6 in the dielectric trench is $SiO_2$, which is one of the most common dielectric in semiconductor industry. Also dielectric 6 can be dielectrics with a lower permittivity than that of $SiO_2$ and a higher critical breakdown electric field than three times of Si, including but not restricting to SiOF, Carbon doped Oxide (CDO) and SiCOF. The relative permittivity of 3.9 for $SiO_2$ is lower than 11.9 of Si, which enhances the electric field strength in dielectric trench 61 and thus improves BV. The dielectric with a lower relative permittivity than that of $SiO_2$ and a higher critical breakdown electric field than three times of Si helps to further improve BV. In addition, the low permittivity of dielectric 6 in dielectric trench 61 is also beneficial to reduce the gate-drain capacitance and improve switching speed.

As for gate dielectric 4, it can be $SiO_2$ or dielectrics with a higher permittivity than that of $SiO_2$ and with a critical breakdown electric field no less than that of $SiO_2$, including but not restricting to $Si_3N_4$, AlN, $Al_2O_3$ and $HfO_2$. Gate dielectric with a higher permittivity can increase the control of gate voltage to gate charges and hence enhance the transconductance. Said gate dielectric can be thicker at the same gate structure MIS (Metal-Insulator-Semiconductor, gate electrode-gate dielectric-the semiconductor under the gate dielectric forming the MIS structure) capacitance, which reduces the tunnel current and avoids tunnel breakdown, and thus enhances the stability as well as reliability of the device or chips.

As for said buried dielectric layer 2, $SiO_2$ is the dielectric commonly used. Dielectric, which has a lower permittivity than that of $SiO_2$ and a higher critical breakdown electric field than three times of Si, can be used as buried dielectric layer 2, including but not restricting SiOF, Carbon doped Oxide (CDO), or SiCOF. Using buried dielectric layer with a lower permittivity, electric field in the buried dielectric layer 2 can be enhanced and thus improves breakdown voltage.

In the present invention, the substrate material can be n- or p-type semiconductor material, or dielectric material. Even the substrate material can be dielectric, which can be the same material as dielectric buried layer or not.

Figure 13:
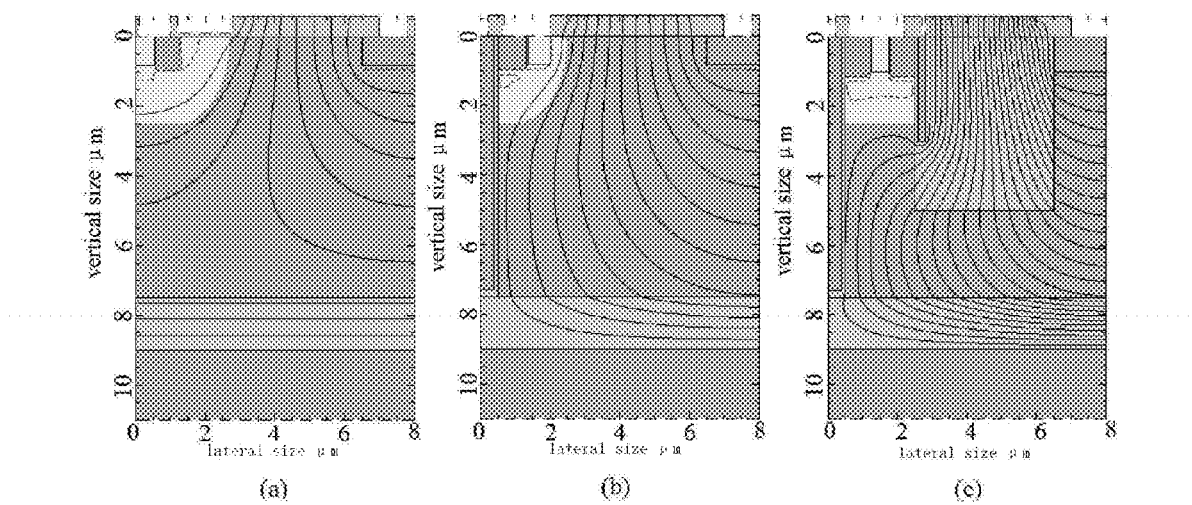
FIG. 13 is two dimensional equipotential contours (for half-cell)

FIG. 13 shows equi-potential contours for three device structures (for a half-cell), herein 10V/contour. FIG. 13(a) is the conventional planner gate LDMOSFET structure (without trench gate, buried gate and dielectric trench); FIG. 13(b) is a trench gate lateral MOSFET without dielectric trench; FIG. 13(c) is a lateral SOI MOSFET, with a trench gate, buried gate and dielectric trench in the present invention. The BVs in FIGS. 13(a),(b) and (c) are 109V, 130V and 254V, respectively. Compared FIG. 13(a) with FIG. 13(b), it can be seen that said trench gate increases breakdown voltage from 109V of the conventional SOI LDMOS to 130V; furthermore, compared FIG. 13(b) with FIG. 13(c), it can be seen that said dielectric trench increases breakdown voltage from 130V to 254V, i. e. increases by 100%.

Figure 14:
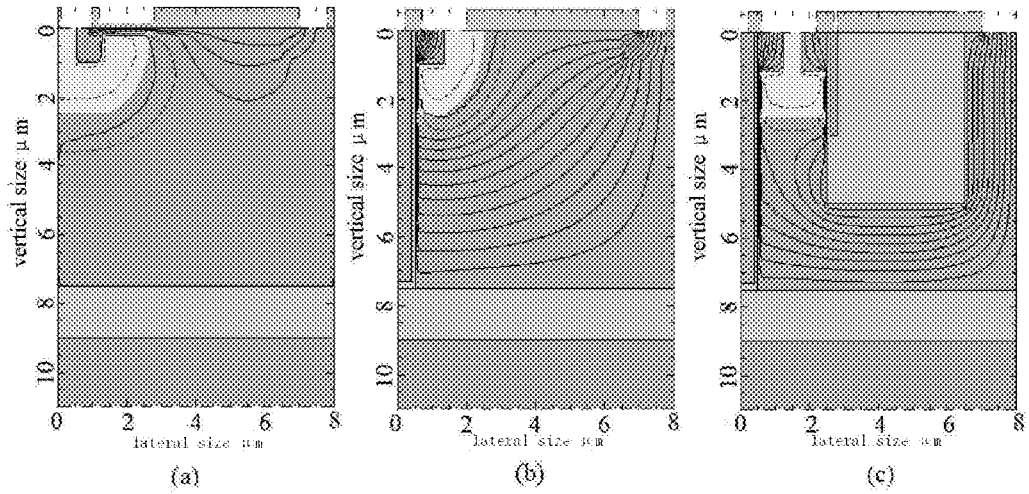
FIG. 14 is two dimensional current flowlines (for half-cell)

FIG. 14 is current flowlines distribution ($1 \times 10^{-6}$ A·$\mu m^{-1}$/ contour). FIG. 14(a) is the conventional planner gate LDMOSFET structure (without trench gate, buried gate and dielectric trench); FIG. 14(b) is a trench gate lateral MOSFET without dielectric trench; FIG. 14(c) is a lateral SOI MOSFET with a trench gate, buried gate and dielectric trench in the present invention. For the conventional SOI LDMOSFET in FIG. 14(a), current flows just at device surface, wherein the effective conductive area is small. Compared with the devices in FIGS. 14(a) and (b), said trench gate 8 increases the vertically effective conductivity area in FIG. 14(b), thus greatly reduces the specific on-resistance. Therefore, the specific on-resistance for the device in FIG. 14(b) reduces to 4 m$\Omega$·cm$^2$ from 7.7 m$\Omega$·cm$^2$ for the device in FIG. 14(a). Compared FIG. 14(b) with FIG. 14(c), although the dielectric trench 61 occupies a large conductive region of the drift region, the optimal doping in the drift region thus increases; moreover, trench-gate and buried-gate increase channel density. Therefore, the specific on-resistance of the present invention reduces to 3.5 m$\Omega$·cm$^2$ at the same device size.

In summary, the device structure in the present invention improves the breakdown voltage and greatly reduces pitch size, wherein said dielectric trench 61 plays an important role; on the other hand, the trench gate 8 extends the effective conductive area in the vertical direction, dramatically reduces the specific on-resistance; moreover, dual gates of trench gate 8 and buried gate 7 increase channel density and current density, resulting in a reduced specific on-resistance and power loss; lastly, dielectric trench reduces the gate-drain capacitance and improves frequency and output power.

Figure 1:
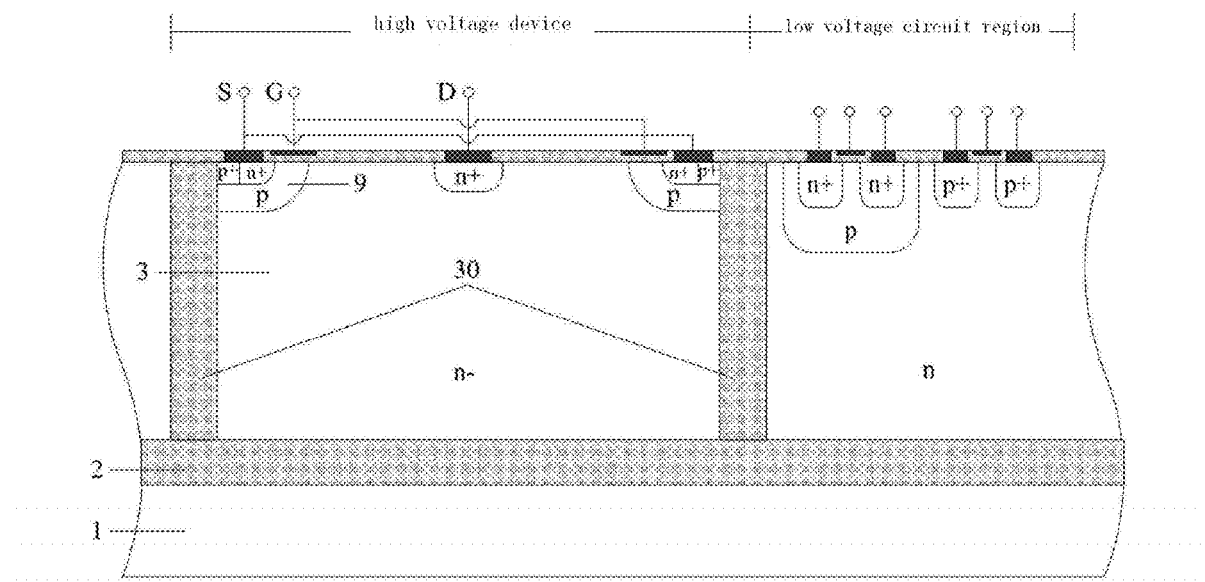
FIG. 1 is the schematic cross section of a conventional SOT high voltage IC.
Figure 2:
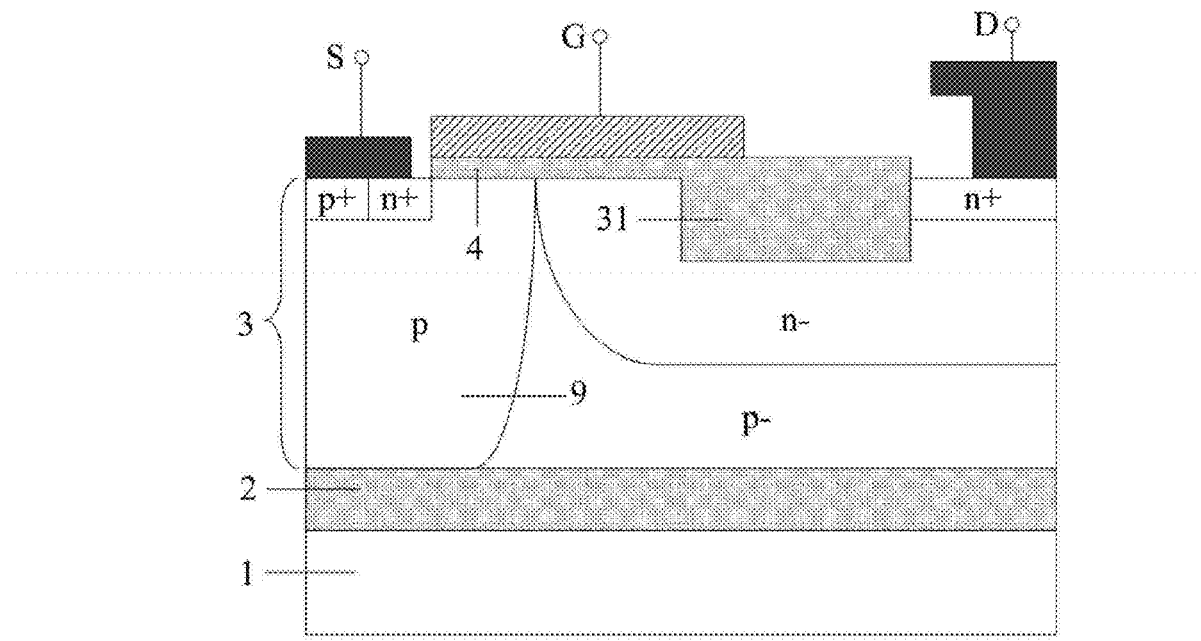
FIG. 2 is the schematic of an SOT RESURF LDMOSFET with a trench.
Figure 3:
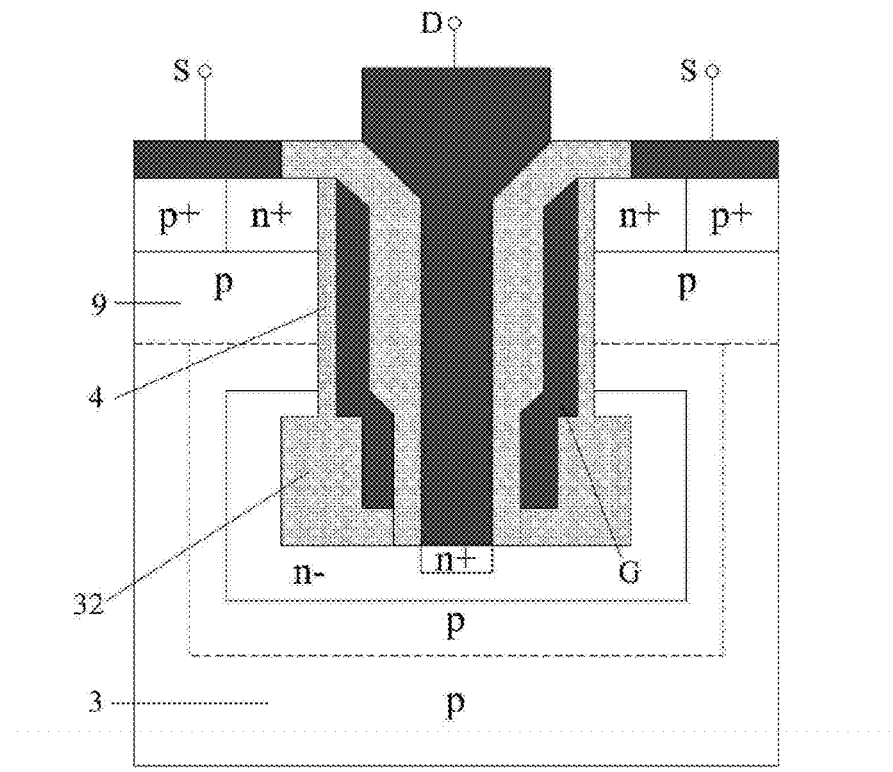
FIG. 3 is the schematic of a TLPM/D MOSFET.
Figure 4:
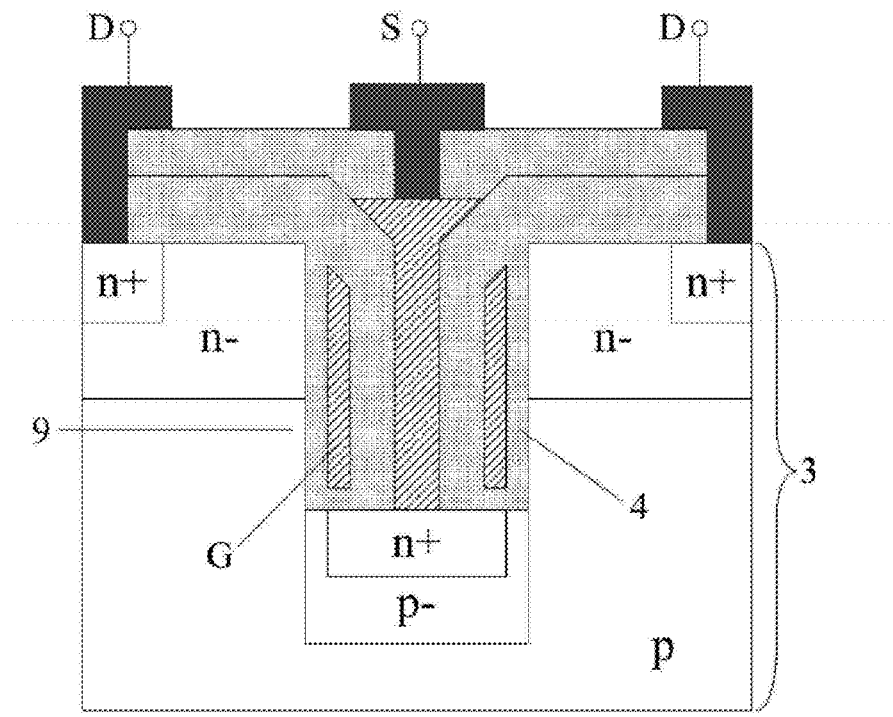
FIG. 4 is the schematic of a TLPM/S MOSFET.
Figure 15:
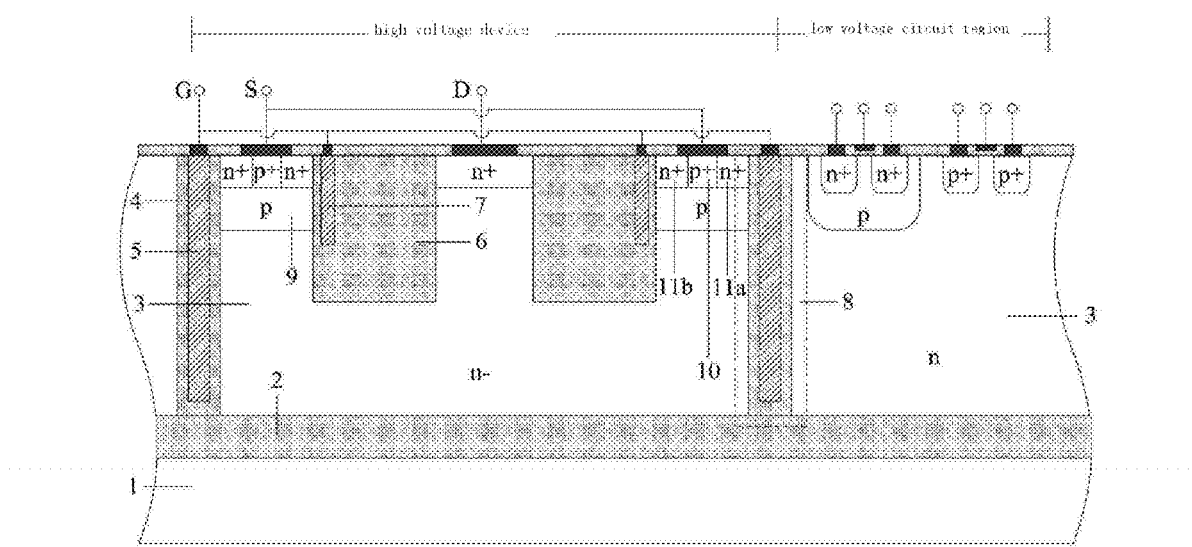
FIG. 15 is the schematic of an integrated circuit, wherein the high voltage device in the present invention is isolated from the low voltage circuit.

FIG. 15 is the schematic of an integrated circuit, wherein the high voltage device in the present invention is isolated from the low voltage circuit. In the HVIC, the trench gate acts as isolation trench between high-voltage device and the low-voltage circuit. This cancels the dielectric isolation trench (i. e. region 30 in FIG. 1) and thus simplifies the isolation process and reduces cost.

What is claimed is:

1. An SOI lateral MOSFET device comprising
    a semiconductor substrate layer,
    a dielectric buried layer, on said semiconductor substrate layer,
    an active layer on said dielectric buried layer,
    a trench gate in said active layer, consisting of gate dielectric and conductive material surrounded by the gate dielectric, wherein the terminal of said conductive material is trench gate electrode,
    wherein, the trench gate going through the active layer to said dielectric buried layer, a drain region and a body region separating from each other on said active layer surface on a side of said trench gate, and drain electrode acting as the drain region terminal,
    source region a, body contact region and source region b on the surface of said body region in sequence, with a source electrode as their common terminal,
    said body region and source region a is in contact with said trench gate,
    a dielectric trench located between said source region b and said drain region, being in contact with said body region and source region b, wherein the permittivity of the dielectric in said dielectric trench is lower than that of the material of said active layer, the depth of the said dielectric trench is larger than that of the body region and less than the thickness of the active layer, a buried gate of conductive material inset in said dielectric trench in the vicinity of the source region b and surrounded by the dielectric in said dielectric trench, with a depth no less than that of said body region and less than that of dielectric trench, the terminal of said buried gate is the buried gate electrode, said trench gate electrode and buried gate electrode are connected electrically, and the common terminal of said trench gate electrode and buried gate electrode is a gate electrode.

2. The lateral SOI MOSFET device according to claim 1, wherein said the lateral SOI MOSFET device is a symmetrical structure, the drain region is in the center of the device, and the dielectric trench, source region b, body contact region, source region a and the trench gate are arranged in sequence outward from said drain region, with the trench gate in the periphery of the device.

3. The lateral SOI MOSFET device according to claim 2, wherein the lateral SOI MOSFET device is a plane symmetry structure, and the symmetry plane is the plane which divides the drain region into two equal parts and does not go through the said dielectric trench and trench gate.

4. The lateral SOI MOSFET device according to claim 2, wherein the lateral SOI MOSFET device is an axi-symmetry structure, and the center axis of said drain region is the axis of symmetry.

5. The lateral SOI MOSFET device according to claim 1, wherein the upper portion of the gate dielectric is thinner than the lower portion of the gate dielectric.

6. The lateral SOI MOSFET device according to claim 1, wherein there are n dielectric trenches separating from each other, where n≥2 and said buried gate is located in the dielectric trench in contact with the body region.

7. The lateral SOI MOSFET device according to claim 6, wherein the conductivity type of a part of the active layer between dielectric trenches is the same as or different from that of other part of said active layer.

8. The lateral SOI MOSFET device according to claim 6, wherein the vertical depth and horizontal width of each dielectric trench, and space between two adjacent dielectric trenches are equal or not equal.

9. The lateral SOI MOSFET device according to claim 6, wherein the dielectric trench in the middle is deeper than the dielectric trenches on both sides when n>3.

10. The lateral SOI MOSFET device according to claim 6, wherein said drain region is in contact with said dielectric trench or not.

11. The lateral SOI MOSFET device according to claim 6, wherein said lateral SOI MOSFET device act as an active device used in integrated circuits (ICs).

12. The lateral SOI MOSFET device according to claim 11, wherein said ICs is Power ICs or RF power ICs.

13. The lateral SOI MOSFET device according to claim 1, wherein said drain region is in contact with said dielectric trench or not.

14. The lateral SOI MOSFET device according to claim 1, wherein said lateral SOI MOSFET device act as an active device used in integrated circuits (ICs).

15. The lateral SOI MOSFET device according to claim 14, wherein said ICs is Power ICs or RF power ICs.

16. The lateral SOI MOSFET device according to claim 1, wherein the material of said active layer includes but does not restrict to Si, SiC, SiGe, GaAs or GaN.

17. The lateral SOI MOSFET device according to claim 16, wherein said active layer is Si material and the dielectric in said dielectric trench is $SiO_2$ or the dielectric with a lower permittivity than that of $SiO_2$ and with a higher critical electric field than three times of Si, and said dielectric includes but does not restrict to SiOF, Carbon doped Oxide (CDO) or SiCOF.

18. The lateral SOI MOSFET device according to claim 16, wherein said active layer is Si material and gate dielectric is $SiO_2$ or the dielectric with a higher permittivity than that of $SiO_2$ and said gate dielectric includes but does not restrict to $Si_3N_4$, $Al_2O_3$, AlN or $HfO_2$.

19. The lateral SOI MOSFET device according to claim 16, wherein said active layer is Si material and said dielectric buried layer is $SiO_2$ or the dielectric with a lower permittivity than that of $SiO_2$ and a higher critical electric field than three times of Si, and said dielectric buried layer includes but does not restrict to SiOF, Carbon doped Oxide (CDO) or SiCOF.

* * * * *